United States Patent

Abbott et al.

[11] Patent Number: 5,976,914
[45] Date of Patent: Nov. 2, 1999

[54] METHOD OF MAKING PLASTIC PACKAGE FOR A SURFACE MOUNTED INTEGRATED CIRCUIT

[75] Inventors: John H. Abbott, Missouri City; Navinchandra Kalidas, Houston; Raymond W. Thompson, Sugar Land, all of Tex.

[73] Assignee: Texas Instruments Incorporated, Dallas, Tex.

[21] Appl. No.: 08/918,404

[22] Filed: Aug. 26, 1997

Related U.S. Application Data

[62] Division of application No. 08/769,917, Dec. 19, 1996, Pat. No. 5,777,382.

[51] Int. Cl.⁶ .......................... H01L 21/44; H01L 21/48; H01L 21/50
[52] U.S. Cl. .......................... 438/123; 438/106; 438/121; 438/124
[58] Field of Search ................................ 438/123, 124, 438/121, 106

[56] References Cited

U.S. PATENT DOCUMENTS

| | | | |
|---|---|---|---|
| 5,200,367 | 4/1993 | Ko | 438/124 |
| 5,474,957 | 12/1995 | Urushima | 438/123 |
| 5,736,432 | 4/1998 | Mackessy | 438/123 |
| 5,753,532 | 5/1998 | Sim | 438/123 |

*Primary Examiner*—Kevin M. Picardat
*Assistant Examiner*—Deven Collins
*Attorney, Agent, or Firm*—Robert D. Marshall, Jr.; Gerald E. Laws; Richard L. Donaldson

[57] ABSTRACT

In accordance with the invention, integrated circuit dies may be packaged in a plastic package employing an area area array technology such as a conductive ball grid array, column grid array or pin grid array. One aspect of the invention is an integrated circuit package (10) which includes an electronic circuit enclosed by a plastic body (12, 14). The molded plastic body has a first major surface opposing a second major surface. The first major surface of integrated circuit (10) has a plurality of openings therein. One of a plurality of conductive pads (18) is adjacent to each one of the openings and is electrically connected to the electronic circuit. Each of a plurality of conductors (20) is electrically connected to one of the pads (18) and protrudes from one of the openings (22).

5 Claims, 2 Drawing Sheets

METHOD OF MAKING PLASTIC PACKAGE FOR A SURFACE MOUNTED INTEGRATED CIRCUIT

This is a division of application Ser. No. 08/769,917, filed Dec. 19, 1996 U.S. Pat. No. 5,777,382.

TECHNICAL FIELD OF THE INVENTION

This invention relates generally to packaging for electronic circuits and more particularly to plastic packaging of surface mounted integrated circuit packages such as ball grid arrays.

BACKGROUND OF THE INVENTION

Surface mounted integrated circuit packages are becoming increasingly popular in the semiconductor industry especially for VLSI circuits requiring a large number of terminals. Some popular surface mount technologies, include J-form, gull-wing, or area array configurations. The area array technologies normally comprise a packaged integrated circuit connected to a number of terminals protruding from the bottom of the integrated circuit package. These terminals can be pins, nearly spherical-shaped balls and/or column-type structures made from solder. These area array technologies, however, are expensive compared to other surface mount technologies.

Array surface mount technologies normally employ either ceramic materials or laminated printed circuit board materials. Metal lines and via holes transfer electrical contacts internal to the package and allow connection of each of the terminals to the integrated circuit die. Thus, packaging for area array surface mount technologies often includes multiple layers. Multiple layer packages are more difficult to design, more difficult to manufacture, and more costly than other surface mount technologies.

Other surface mount technologies for integrated circuit packages include dies attached to a lead frame enclosed by a plastic package and utilizing J-form or gull wing leads as terminals protruding from the perimeter of the package. Although less expensive and easier to manufacture than common area area array packages, integrated circuit packages using J-form and gull wing leads also suffer from several disadvantages. First, for a given surface area of the integrated circuit package, an area array integrated circuit package can have more terminals than J-form or gull wing integrated circuit packages.

Second, as manufacturers have increased the number of leads in integrated circuit packages employing J-form and gull wing-type leads, those leads have become closer together and have been constructed of thinner and narrower metal. Such construction leads to two problems. The leads are more easily damaged if the integrated circuit package is improperly handled or dropped. Also, the closeness of the leads increases the difficulty of soldering such an integrated circuit package to a circuit board.

SUMMARY OF THE INVENTION

This invention allows plastic packaging of integrated circuits using area array surface mount technologies, thus reducing the cost and difficulty of manufacturing integrated circuits packaged using area array technologies. One aspect of the invention is an integrated circuit package having an electronic circuit enclosed in a molded plastic body. The molded plastic body has a first major surface opposing a second major surface. Conductive pads are positioned adjacent to openings in the first major surface and are electrically connected to the electronic circuit. A conductor is electrically connected to at least one of the pads and protrudes from one of the openings.

The invention has several important technical advantages. First, the invention allows existing plastic packaging techniques to be used with area array surface mount technologies. By taking advantage of existing transfer molding technology with proven reliability and ease of manufacturability, the benefits of area array technologies can be exploited without the disadvantages of existing ceramic or laminated PCB packaging options. One embodiment of the invention may eliminate the need for alignment fixtures to place preforms or balls during the ball attach process. Integrated circuits that are packaged using the invention will have a lower cost and will be easier to manufacture than existing area array surface mount integrated circuit packages.

The invention can be used with integrated circuit packages currently having J-form or gull wing-type leads. When the invention is used in this way, the footprint of the resulting area array plastic packaged integrated circuit can be either reduced or remain the same size as the existing integrated circuit package. In addition, the same lead placement could be maintained so that the user of such an integrated circuit package need only perform minimal redesign work on the circuit board to which the new area array circuit is to be mounted. This will allow manufacturers of electronic appliances to capitalize on the durability and mounting advantages of the invention without having to significantly redesign the circuit boards for an existing electronic appliance.

The balls, pins, or columns in the invention can be attached to portions of a lead frame enclosed within a plastic package. The ends of the leads on the lead frame can protrude from openings on the sides of the plastic package, thus allowing easy board level electrical testing.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1–4 of the drawings, like numerals being used for like and corresponding parts of the various drawings.

Figure 1:
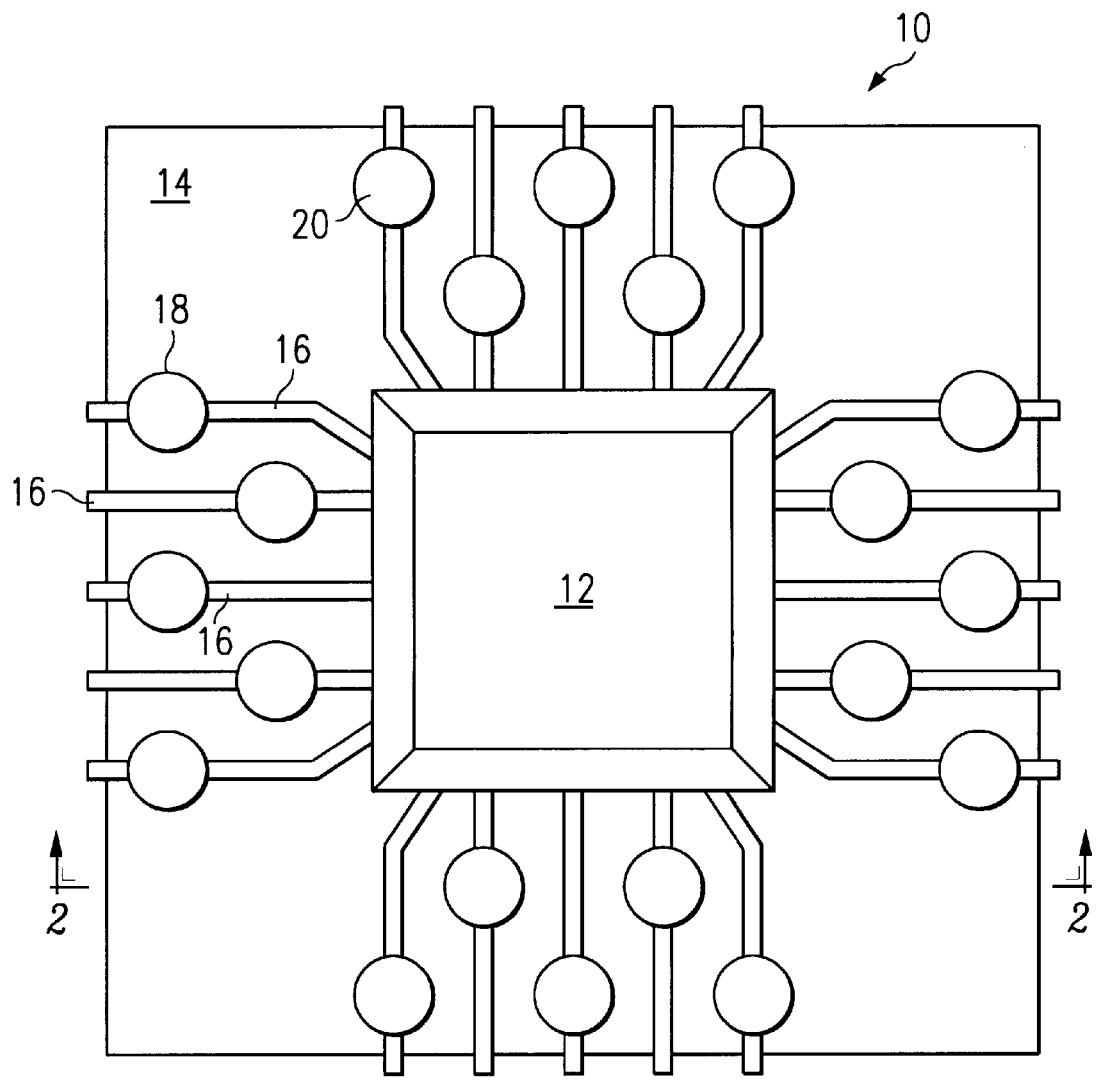
FIG. 1 illustrates a bottom view of a first embodiment of an integrated circuit package constructed in accordance with the invention.

FIG. 1 illustrates a first embodiment of an integrated circuit package 10 constructed in accordance with the invention. Integrated circuit package 10 comprises package bottom 12, package top 14, lead fingers 16, pads 18 and solder balls 20. Package bottom 12 and package top 14 enclose an integrated circuit die (not explicitly shown). Package bottom 12 and package top 14 are plastic and can be manufactured using transfer molding technology. FIG. 1 is a bottom view of integrated circuit package 10, and it shows the bottom surface of package top 14.

Solder balls 20 serve as the terminals for integrated circuit package 10. The solder balls 20 are connected to pads 18. Pads 18 are conductive, circular in shape, and have a diameter approximately the same as the diameter of one of the solder balls 20. Each of the pads 18 is also connected to one of the lead fingers 16. Each of the lead fingers 16 is a portion of a lead frame (not explicitly shown) connected to the integrated circuit die (not explicitly shown). Although the pads 18 are connected to the lead fingers 16 in this example, they may be an integral part of the lead fingers 16.

The lead frame, which is comprised of lead fingers 16, is of the type commonly used for plastic packaged integrated circuits. Thus, given a particular integrated circuit die, the same lead frame previously used in a gull-wing or J-form type circuit can also be used for that die in integrated circuit package 10, except that the lead fingers 16 should be altered such that pads 18 are an integral portion thereof or to allow pads 18 to be attached. The invention thus allows lead frames presently used for integrated circuits to be quickly modified for use in integrated circuit package 10.

In this embodiment, package bottom 12 is smaller than package top 14. Each of the lead fingers 16 comprises a conductive strip electrically connected to the integrated circuit die. Because package bottom 12 does not cover the perimeter of integrated circuit package 10, the portion of each lead finger 16 visible in FIG. 1 is exposed.

Figure 2:
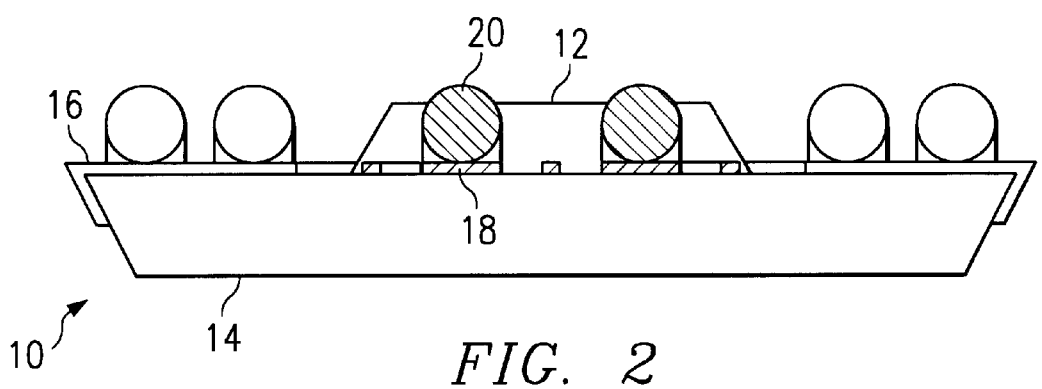
FIG. 2 illustrates a cross-sectional view of the integrated circuit package of FIG. 1.

FIG. 2 illustrates a cross-sectional view facing in the direction of the arrows labeled "2" in FIG. 1. This cross-sectional view illustrates how each of the lead fingers 16 can be excised and wrapped around package top 14. This configuration helps keep each of the lead fingers 16 in place and prevents them from separating and peeling away from the underside of package top 14. The ends of lead fingers 16 bend around the side of package top 14 and substantially conform to its shape. This feature of the invention allows easier component level and subsequent board level electrical testing. Conductors for test connectors can be directly connected to the portion of the lead fingers 16 that bends around the side of package top 14.

The embodiment of integrated circuit package 10 illustrated in FIG. 1 may be especially useful in applications where one desires to convert an integrated circuit currently having J-form or gull wing-type leads into a plastic packaged area array integrated circuit. Using the embodiment illustrated in FIG. 1, the lead fingers 16 can have the same spacing as previously used in the J-form or gull wing package. Rather than extending the lead fingers 16 out the side of integrated circuit package 10 to make J-form or gull wing leads, pads 18 are connected to the lead fingers 16 to allow attachment of solder balls 20. Then, an electronic appliance manufacturer that seeks to use integrated circuit package 10 in an electronic appliance can make small modifications to the pad placement that was used for the J-form or gull wing version of the integrated circuit package in order to allow use of integrated circuit package 10. Thus, the invention allows users of integrated circuit package 10 to easily convert circuit boards used with existing J-form or gull wing plastic packaged integrated circuits into boards that can be used with area array plastic packaged integrated circuits such as integrated circuit package 10. Similar advantages can be obtained with the embodiment of integrated circuit package 10 illustrated in FIGS. 3 and 4 below.

Figure 3:
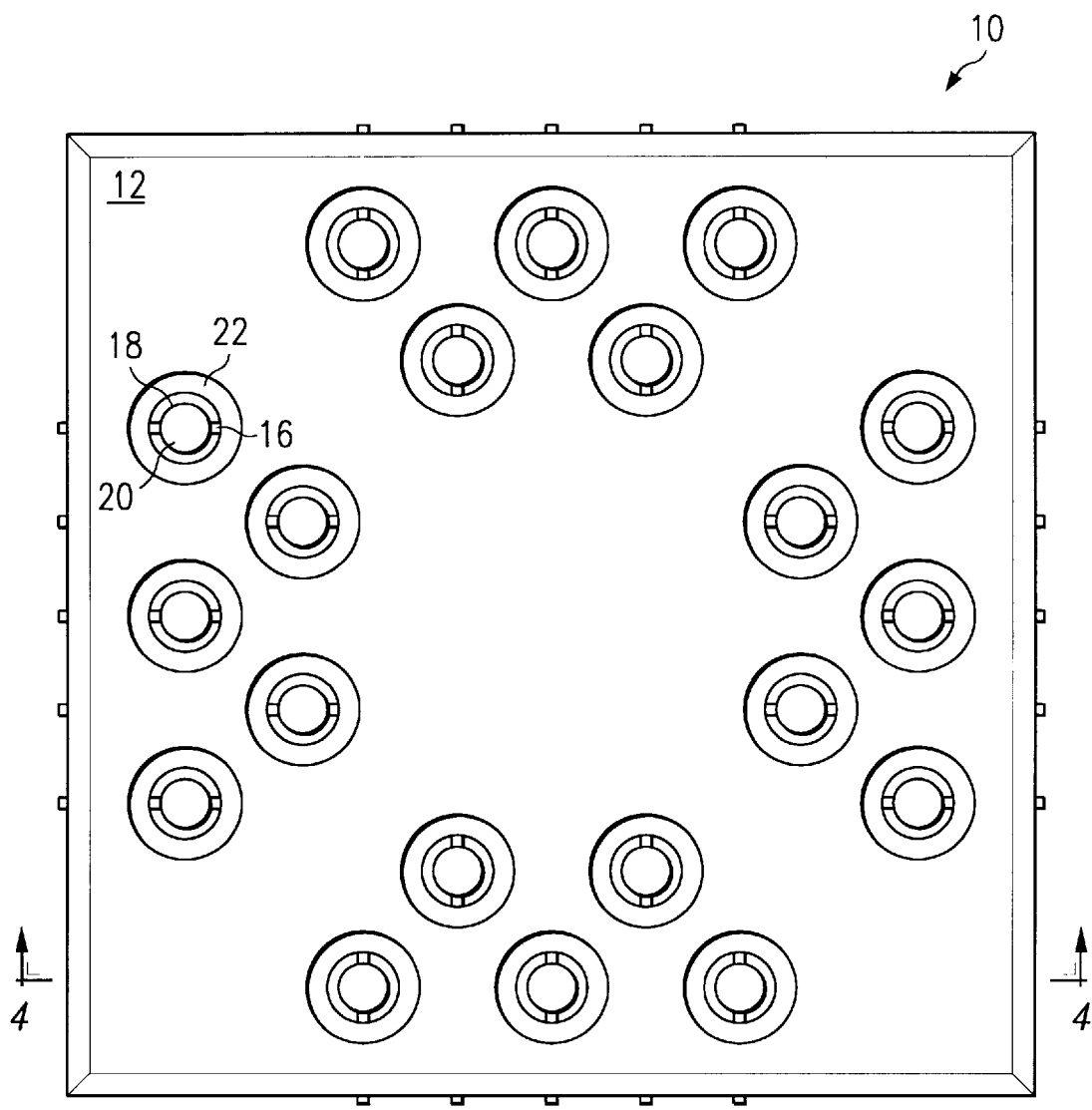
FIG. 3 illustrates a second embodiment of an integrated circuit package constructed in accordance with the invention.

FIG. 3 illustrates a second embodiment of integrated circuit package 10 constructed in accordance with the invention. In this embodiment, however, package bottom 12 has a perimeter substantially the same as the perimeter of package top 14 (not shown in FIG. 3). In this embodiment, package bottom 12 has a plurality of openings 22 from which the solder balls 20 protrude. Openings 22 expose a substantially smaller portion of lead fingers 16 than is exposed in the embodiment illustrated in FIG. 1.

This embodiment of integrated circuit package 10 also has an integrated circuit die (not explicitly shown) that comprises some type of electronic circuit. Package bottom 12 and package top 14 (not explicitly shown in FIG. 3) form a molded plastic body enclosing the electronic circuit. This plastic body has top and bottom surfaces opposing one another that form the major surfaces of the package of integrated circuit package 10.

Each of the solder balls 20 is electrically connected to one of the pads 18. As with the embodiment illustrated in FIG. 1, pads 18 may be bonded to lead fingers 16 or may form an integral portion thereof. Each of the pads 18 is conductive, adjacent to one of the openings 22, and electrically connected to the integrated circuit die through one of the lead fingers 16.

Each of the lead fingers 16 forms a portion of the lead frame (not explicitly shown), which is at least partially enclosed by the molded plastic body formed by package bottom 12 and package top 14. The lead frame is electrically connected to the integrated circuit die.

Figure 4:
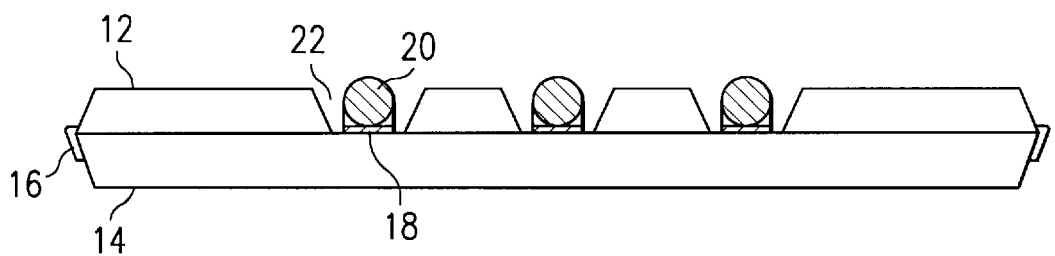
FIG. 4 illustrates a cross-sectional view of the integrated circuit package of FIG. 3.

FIG. 4 illustrates a cross-sectional view of the embodiment of FIG. 3 facing in the direction of the arrows labeled "4." The ends of the lead fingers 16 are excised and wrapped around the side of package top 14. In other words, the ends of lead fingers 16 are wrapped around minor surfaces of integrated circuit package 10. In this embodiment, lead fingers 16 are wrapped around the side of package top 14 for reasons similar to those discussed in connection with FIG. 2 above.

Both of the embodiments of integrated circuit package 10 illustrated in FIGS. 1 and 3 can be manufactured using similar processes. The integrated circuit die can be connected to the lead frame and packaged using existing transfer molding technology. Solder balls 20 may be formed or attached on pads 18 using any known method for creating solder balls 20.

Although the invention has been described in connection with the embodiments illustrated in FIGS. 1–4, various substitutions can be made without departing from the scope of the invention. For example, the embodiments illustrated in FIGS. 1–4 use lead fingers 16 comprising part of a lead frame to electrically connect the solder balls 20 to the integrated circuit die. Other structures could be used inside of integrated circuit package 10 to connect the solder balls to the integrated circuit die. Examples include flex circuits or laminate circuits. Individual conductors could also be connected directly between the integrated circuit die and the solder balls 20.

The embodiments illustrated in FIGS. 1–4 show how the invention can be used to form a plastic packaged ball grid array. The invention can be used for other area array technologies such as column grid arrays or pin grid arrays. In a column grid array, solder columns would be substituted for solder balls 20. In a pin grid array, conductive pins would be substituted for solder balls 20. Solder balls, pins, or solder columns could also be integral portions of the lead frame 16 to which they are attached. Although solder balls 20 are made of solder, they could also be made of another conductive material. The number, spacing, and size of solder balls 20 can also be varied.

In the embodiments discussed above, lead fingers 16 are excised and wrapped around package top 14. Alternatively, the lead fingers 16 need not protrude from the side of integrated circuit package 10.

Although the present invention has been described in detail, it should be understood that various changes, substitutions, and alterations can be made hereto without departing from the spirit and scope of the invention as defined by the appended claims.

What is claimed is:

1. A method of making an integrated circuit package, comprising:

forming an integrated circuit having a plurality of conductors;

forming a lead frame having a plurality of lead fingers equal in number to the number of the plurality of conductors of the integrated circuit;

connecting each lead finger of the lead frame to a corresponding one of the conductors of the integrated circuit;

attaching a circular conductive pad having a predetermined diameter to each of the lead fingers of the lead frame;

enclosing an electronic circuit within and at least partially enclosing the lead frame within a molded plastic body having a first major surface, the first major surface having the plurality of circular conductive pads adjacent thereto;

metallically bonding a conductive ball having the predetermined diameter to each circular conductive pad.

2. The method of claim 1, wherein:

said step of attaching a circular conductive pad to each of the lead fingers of the lead frame consists of forming the lead finger having the circular conductive pad as an integral portion thereof.

3. The method of claim 1, wherein:

said step of attaching a circular conductive pad to each of the lead fingers of the lead frame consists of attaching a circular conductor to the lead finger.

4. The method of claim 1, wherein:

said step of enclosing within a molded plastic body further includes forming at least one second surface adjacent the first major surface; and said method further includes bending extending ends of the lead fingers of the lead frame to substantially conform to the at least one second surface.

5. The method of claim 1 wherein:

said step of enclosing within a molded plastic body further includes forming holes in registration with the circular conductive pads; and said step of metallically bonding a conductive ball having the predetermined diameter to each circular conductive pad includes disposing each conductive pad within a hole in registration with the corresponding circular conductive pad.

\* \* \* \* \*